United States Patent
Jezersky et al.

(10) Patent No.: US 9,341,664 B2
(45) Date of Patent: May 17, 2016

(54) LED FAILURE DETECTION

(71) Applicant: Varroc Lighting Systems s.r.o., Senov u Noveho Jicina (CZ)

(72) Inventors: Jaroslav Jezersky, Suchdol nad Odra (CZ); Matej Smrek, Presov (SK)

(73) Assignee: VARROC LIGHTING SYSTEMS, S.R.O. (CZ)

( * ) Notice: Subject to any disclaimer, the term of this patent is extended or adjusted under 35 U.S.C. 154(b) by 53 days.

(21) Appl. No.: 14/144,798

(22) Filed: Dec. 31, 2013

(65) Prior Publication Data

US 2014/0210507 A1    Jul. 31, 2014

(30) Foreign Application Priority Data

Jan. 29, 2013 (CZ) .................................. PV 2013-55

(51) Int. Cl.
*G01R 31/00* (2006.01)
*H05B 33/08* (2006.01)

(52) U.S. Cl.
CPC ............ *G01R 31/006* (2013.01); *H05B 33/089* (2013.01)

(58) Field of Classification Search
CPC .................................................... G01R 31/006
USPC .................................................... 324/762.07
See application file for complete search history.

(56) References Cited

U.S. PATENT DOCUMENTS

| 5,313,114 | A  | * | 5/1994 | Poletto et al. ..................... 327/65 |
| 7,528,553 | B2 | * | 5/2009 | Ito et al. .......................... 315/291 |
| 8,860,427 | B2 | * | 10/2014 | Cortigiani et al. ............. 324/522 |
| 2006/0170287 | A1 | * | 8/2006 | Ito et al. ........................ 307/10.1 |
| 2007/0132407 | A1 | * | 6/2007 | Namba .............. H05B 33/0815 315/312 |

FOREIGN PATENT DOCUMENTS

| DE | 101 31 824 A1 | 2/2003 |
| EP | 2 487 998 A1 | 8/2012 |
| WO | 2008141384 A1 | 11/2008 |

* cited by examiner

*Primary Examiner* — Tung X Nguyen
*Assistant Examiner* — Zannatul Ferdous
(74) *Attorney, Agent, or Firm* — Cantor Colburn LLP

(57) ABSTRACT

A fault detecting circuit in a string of LEDs D1-Dc containing comparing operational amplifiers IC1/IC2 connected to a current source is divided into sections, D1-Da, D2-Db, and D3-Dc, wherein the common between the Da cathode and the D2 anode is connected to the noninverting-input of IC1, while the common between the Db cathode and the D3 anode is connected to the noninverting-input of IC2, and to the string D1-Db is connected in parallel to a divider comprising R1/R2, while the string comprising D2-Dc is connected in parallel to a divider comprising R3/R4, and the common of R1/R2 is connected to the inverting-input of IC1 and the common of R3/R4 is connected to the inverting-input of IC2, while the outputs of IC1/IC2 are connected to the bases of corresponding transistors T1/T2, whose emitters are connected to ground and collectors are connected to the voltage source and also to the output terminal.

10 Claims, 1 Drawing Sheet

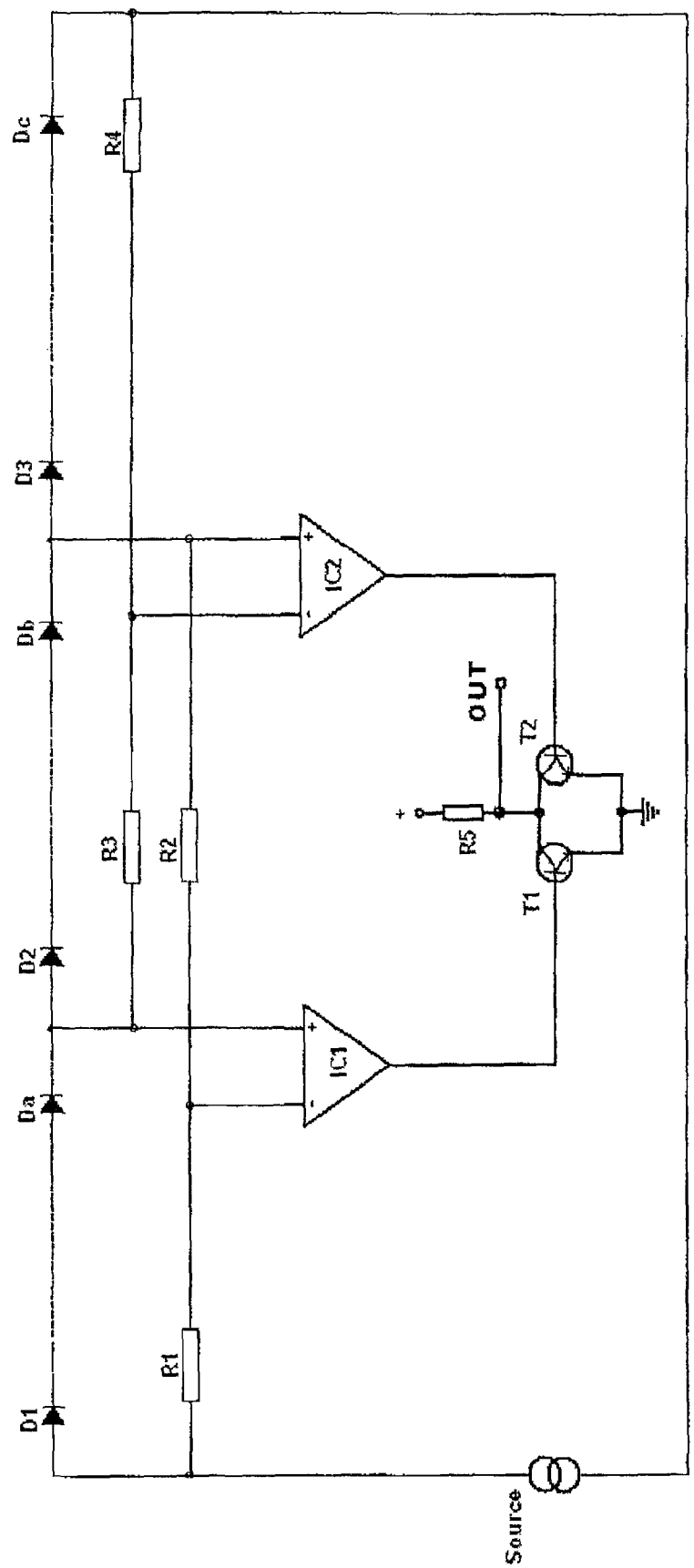

LED FAILURE DETECTION

CROSS-REFERENCES TO RELATED APPLICATIONS

This patent application claims priority to Czech Republic Patent Application Serial No. PV 2013-55 filed on Jan. 29, 2013, which is incorporated herein by reference in its entirety.

BACKGROUND OF THE INVENTION

The proposed invention relates to a circuit of a fault detection device for light emitting diodes (LEDs) in the outside lights of motor vehicles, which contains at least one string made up of LED diodes.

At present, when not only classical incandescent bulb lamps or halogen lamps but also in ever increasing extent lamps based on light emitting diodes are being used in motor vehicles as an outside light source, there are a number of circuits for fault indication in the strings of connected LED diodes. These circuits, which are designed as electronic circuits based on semiconductor components, are all protected by patent documents.

The circuit according to DE10131824A1 for detection of faults of the individual diodes in a LED array in a vehicle is based on comparing the potentials with reference potentials of data pertaining to the main driving potential by means of comparators.

The circuit according to U.S. 2006170287A1 also uses comparators for the detection, picking off the voltage on the string of LED diodes divided into two parts, where one section of the string contains a single LED diode.

The circuit according to EP2487998A1 is a solution for identification of at least one defective LED diode in the string, where an inspecting unit is connected to the midpoints of parallel strings of LED diodes and a resistance divider.

The circuit according to WO2008141384A1 is a device for determining the fraction of defective light emitting diodes by using a differential amplifier, where the strings of diodes are connected across a resistance divider to this amplifier.

In these solutions, their properties and thus their uses and advantages or disadvantages and limitations are essentially determined by the electronic elements used and their mutual connection for a given specific application, the number of LED diodes, and so on.

SUMMARY OF THE INVENTION

In an exemplary embodiment, a fault detecting circuit in a string of light emitting diodes comprising an evaluating element is disclosed. It is a fault detecting circuit in a string of light emitting diodes comprising an evaluating element, wherein the string comprises light emitting diodes D1 to Dc configured for connection to a source of driving current is divided into three sections, a first section comprising diodes D1 to Da, a second section comprising diodes D2 to Db, and a third section comprising diodes D3 to Dc, and wherein a first common point between a cathode of a last diode Da of the first section and an anode of the first diode D2 of the second section is connected to an input of a first evaluating element (IC1), while a second common point between a cathode of the last diode Db of the second section and an anode of the first diode D3 of the third section is connected to an input of a second evaluating element (IC2), and a portion of the string comprising diodes D1 to Db is connected in parallel to a divider comprising a first resistor (R1) and a second resistor (R2), while a portion of the string comprising diodes D2 to Dc is connected in parallel to a divider comprising a third resistor (R3) and a fourth resistor (R4), and a third common point of R1 and R2 is connected to the input of the IC1 and a fourth common point of R3 and R4 is connected to the input of IC2, while an output of each of the two evaluating elements IC1, IC2 is connected to an input of an adding unit formed by transistors T1, T2, each having an emitter connected to a ground and a collector connected to a voltage source and also to an output terminal (OUT).

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 1 shows the electrical diagram of the fault detector circuit in a string of light emitting diodes.

DETAILED DESCRIPTION

The possible disadvantages of the existing and aforementioned circuits are solved by a fault detecting circuit in a string of light emitting diodes containing comparing operational amplifiers whose essence consists in that the string composed of light emitting diodes connected to a source of driving current is divided into three sections, wherein the common point between the cathode of the last diode of the first section and the anode of the first diode of the second section is connected to the noninverting input of the first comparing operational amplifier, while the common point between the cathode of the last diode of the second section and the anode of the first diode of the third section is connected to the noninverting input of the second operational amplifier, and to the string composed of diodes of the first and second section is connected in parallel a divider composed of a first and second resistor, while to the string composed of diodes of the second and third section is connected in parallel a divider composed of a third and fourth, and the common point of the first and second resistor is connected to the inverting input of the first comparing operational amplifier and the common point of the third and fourth resistor is connected to the inverting input of the second comparing operational amplifier, while the output of each of the two comparing operational amplifiers is connected to the bases of the transistors corresponding in number to the number of operational amplifiers, while their emitters are connected to ground and their collectors are connected to the voltage source and also to the output terminal.

This solution has advantages over the existing ones in detection for various numbers of LED diodes, simple hardware for the indication, and working voltage up to 60 V.

Referring now to the Figures, where the invention will be described with reference to specific embodiments, without limiting same, FIG. 1 shows the design of a fault detector in a string of light emitting diodes. The string composed of light emitting diodes D1 to Dc is connected to a source SOURCE of driving current, being divided into three sections, namely being composed of diodes D1 to Da, next of diodes D2 to Db, and finally D3 to Dc, wherein the common point between the cathode of the last diode Da of the first section and the anode of the first diode D2 of the second section is connected to the noninverting input of a first comparing operational amplifier IC1, while the common point between the cathode of the last diode Db of the second section and the anode of the first diode D3 of the third section is connected to the noninverting input of a second operational amplifier IC2, and to the string composed of diodes D1 to Db is connected in parallel a divider composed of a first and second resistor R1 and R2, while to the string composed of diodes D2 to Dc is connected in parallel a divider composed of a third and fourth resistor R3 and R4, and the common point of the first and second resistor R1 and R2 is connected to the inverting input of the first comparing operational amplifier IC1 and the common point of the third and fourth resistor R3 and R4 is connected to the inverting input of the second comparing operational amplifier IC2, while the output of each of the two comparing operational amplifiers IC1, IC2 is connected to the bases of corresponding transistors T1, T2, whose emitters are connected to ground and the collectors are connected to the voltage source and also to the output terminal OUT.

This solution generally encompasses devices for testing the range of operating voltage of LED diodes that indicates faulty diodes. This detector works with varying number of LED diodes in a row. The power source for driving the LED diodes is a constant current source, but a voltage source can also be used. The sensitivity of detection will vary according to the number of LED diodes between the sections of the string. The maximum number of LED diodes in one section of the string depends on the voltage in the conducting direction. For proper working of the device, there needs to be sufficient filtering out of unwanted pulses—such as by means of pulse width modulation (PWM) switching and the like. The result for a defective LED diode is a lowering of the impedance at the output and a blocking of the inverter.

The solution basically involves a comparing of a string of LED diodes with a resistor divider at the input of an amplifier. The first comparing operational amplifier IC1 compares the voltage values from the midpoint of resistors R1 and R2 and the midpoint between the sections of diodes D1 to Da and then diodes D2 to Db. The second comparing operational amplifier IC2 performs a similar operation at the divider R3, R4 and the sections composed of diodes D2 to Db and D3 to Dc. The second composed of diodes D2 to Db is compared twice by the comparators. This solution increases the precision of the fault detection, since it uses a central section of LED diodes with a double checking. A varying number of LED diodes can be used for the detection. For the same number of rows, we use only two midpoints between the row of LED diodes and the resistance divider. A fault in the LED diodes means a change in state at the output of the transistor T1, T2 and as a result the power supply for the string of LED diodes is switched off.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

The invention claimed is:

1. A fault detecting circuit in a string of light emitting diodes comprising an evaluating element, wherein the string comprises light emitting diodes D1 to Dc in direct, sequential, series connection with one another and configured for connection to a source of driving current is divided into three sequential sections, a first section comprising diodes D1 to Da, a second section comprising diodes D2 to Db, and a third section comprising diodes D3 to Dc, and wherein a first common point between a cathode of a last diode Da of the first section and an anode of the first diode D2 of the second section is connected to a noninverting input of a first evaluating element (IC1), while a second common point between a cathode of the last diode Db of the second section and an anode of the first diode D3 of the third section is connected to noninverting input of a second evaluating element (IC2), and a portion of the string comprising diodes D1 to Db is connected in parallel to a divider comprising a first resistor (R1) and a second resistor (R2), while a portion of the string comprising diodes D2 to Dc is connected in parallel to a divider comprising a third resistor (R3) and a fourth resistor (R4), and a third common point of R1 and R2 is connected to an inverting input of the IC1 and a fourth common point of R3 and R4 is connected to an inverting input of IC2, while an output of each of the two evaluating elements IC1, IC2 is connected to an input of an adding unit formed by transistors T1, T2, each having an emitter connected to a ground and a collector connected to a voltage source and also to an output terminal (OUT).

2. The fault detecting circuit according to claim 1, wherein the fault detecting circuit is formed by an operational amplifier.

3. The fault detecting circuit according to claim 1, wherein the fault detecting circuit is formed by a differential circuit of transistors.

4. The fault detecting circuit according to claim 1, wherein the fault detecting circuit is formed by a comparator.

5. The fault detecting circuit according to claim 1, wherein the fault detecting circuit is formed by input pins of a microprocessor.

6. The fault detecting circuit according to claim 1, wherein IC1 and IC2 are each configured to test a range of operating voltage of the string of light emitting diodes.

7. The fault detecting circuit according to claim 1, wherein IC1 is configured to compare a first voltage value of a midpoint of resistors R1 and R2 with a midpoint of the portion of the string comprising diodes D1 to Da and the portion of the string comprising diodes D2 to Db.

8. The fault detecting circuit according to claim 7, wherein IC2 is configured to compare a second voltage value of a midpoint of resistors R3 and R4 with a midpoint of the portion of the string comprising diodes D2 to Db and the portion of the string comprising diodes D3 to Dc.

9. The fault detecting circuit according to claim 8, wherein IC1 and IC2 are configured to make a second comparison of the voltage value of the midpoint of resistors R1 and R2 and the midpoint of resistors R3 and R4, respectively, with the midpoint of the portion of the string comprising diodes D2 to Db, and wherein the second comparison increases the precision of the fault detection.

10. The fault detecting circuit according to claim 1, wherein IC1 and IC2 comprise comparing operational amplifiers.

* * * * *